(12) United States Patent
Nakamura et al.

(10) Patent No.: US 7,358,648 B2
(45) Date of Patent: Apr. 15, 2008

(54) TORSION RESONATOR AND FILTER USING THIS

(75) Inventors: Kunihiko Nakamura, Kanagawa (JP); Hideki Kawakatsu, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/592,437

(22) PCT Filed: Jan. 13, 2006

(86) PCT No.: PCT/JP2006/300399

§ 371 (c)(1),
(2), (4) Date: Feb. 22, 2007

(87) PCT Pub. No.: WO2006/075717

PCT Pub. Date: Jul. 20, 2006

(65) Prior Publication Data

US 2007/0188272 A1 Aug. 16, 2007

(30) Foreign Application Priority Data

Jan. 13, 2005 (JP) ............................. 2005-006427

(51) Int. Cl.
*H01L 41/04* (2006.01)
*H03H 9/00* (2006.01)
*H03H 9/50* (2006.01)
(52) U.S. Cl. ...................................... 310/333; 310/365
(58) Field of Classification Search ................ 310/320, 310/328, 333, 365
See application file for complete search history.

(56) References Cited

U.S. PATENT DOCUMENTS 7,061,063 B2 * 6/2006 Kato et al. .................. 257/417

2002/0105393 A1 * 8/2002 Clark et al. .................. 333/197

FOREIGN PATENT DOCUMENTS

| JP | 10-512046 | 11/1998 |
| JP | 2003-222817 | 8/2003 |
| JP | 2004-247051 | 9/2004 |

OTHER PUBLICATIONS

Yasumura et al., "Quality Factors in Micron- and Submicron-Thick Cantilevers", Journal of Microelectromechanical Systems, vol. 9, No. 1, Mar. 2000, pp. 117-125.
Bannon et al., " High-Q HF Microelectromechanical Filters", IEEE Journal of Solid-State Circuits, vol. 35, No. 4, Apr. 2000, pp. 512-526.

* cited by examiner

*Primary Examiner*—J. San Martin
(74) *Attorney, Agent, or Firm*—Pearne & Gordon (57) ABSTRACT

The invention provides a high-frequency torsion vibrator which can excite efficiently without having any paddle. The torsion vibrator is configured as a beam structure having an almost constant section and having no paddle and is disposed so as to be close to an electrode via a gap on the side surface of the beam thereof. An electrostatic capacitance between the vibrator and the electrode is adjusted so that the changing amount of the electrostatic capacitance per unit torsion vibration amount becomes maximum or the changing ratio of the electrostatic capacitance per unit AC voltage becomes maximum. This adjustment is made possible by controlling the thickness of the electrode in the case of using the semiconductor process. Further, when the vibrator is formed by monocrystalline silicon and the processing of the beam shape is performed by the anisotropic etching, the fine resonator which has a high Q value and has excellent surface property can be generated.

15 Claims, 10 Drawing Sheets

- 33: SILICON NITRIDE LAYER
- 32: MONOCRYSTALLINE SILICON LAYER
- 31: SILICON OXIDE LAYER
- 30: SILICON SUBSTRATE

{111}
35: SILICON OXIDE LAYER
31: SILICON OXIDE LAYER

SILICON OXIDE LAYER

TORSION RESONATOR AND FILTER USING THIS

TECHNICAL FIELD

The present invention relates to a torsion resonator and a filter using it and, in particular, to a technique of realizing a high-performance filter circuit by using torsion resonation in an electronic circuit integrated with a high density.

BACKGROUND ART

An electromechanical resonator utilizing flexural vibration has been notified in recent years.

Figure 18:
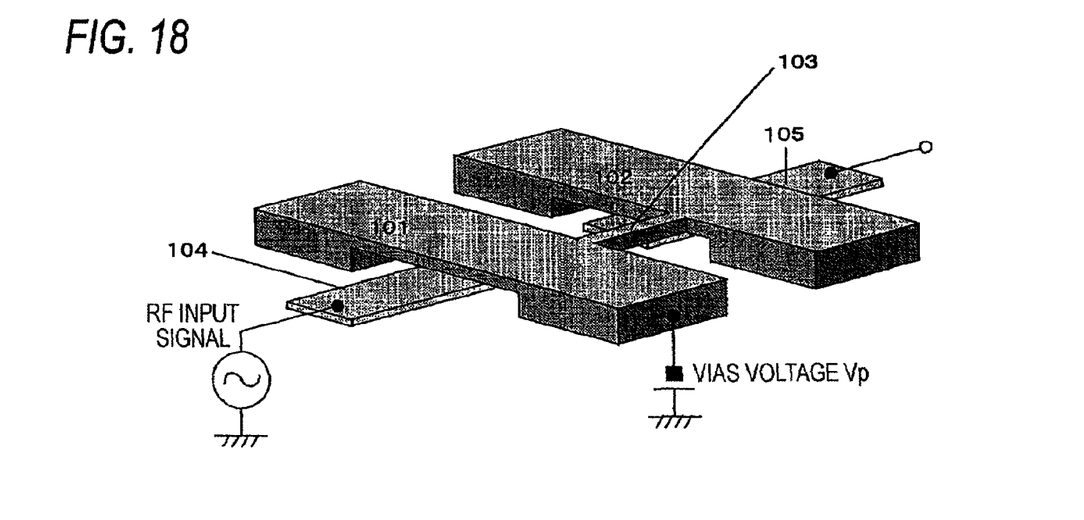
FIG. 18 is a schematic diagram showing a filter using the mechanical resonator according to the related art.

An example of electromechanical resonators of the related art will be explained with reference to FIG. 18. FIG. 18 is a diagram simply showing the configuration of a mechanical vibration filter utilizing the flexural vibration, which is disclosed in a non-patent document 1.

This filter is formed by forming a pattern on a silicon substrate using a thin-film forming process. The filter is configured by an input line 104, an output line 105, both-end-supported beams 101, 102 disposed so as to oppose to the input and output lines with a space of 1 micron or less therebetween, respectively, and a coupling beam 103 for coupling these two both-end-supported beams. A signal inputted from the input line 104 performs capacitive coupling with the beam 101 to generate electrostatic force at the beam 101. The mechanical vibration arise only when the signal frequency is near the resonance frequency of an elastic structure formed by the beams 101, 102 and the coupling beam 103. The mechanical vibration is further detected as the change of an electrostatic capacitance between the output line 105 and the beam 102 thereby to extract the filtrating output of the input signal.

In the case of a both-end-supported beam with a rectangular sectional shape, the resonance frequency f of the flexural vibration will be represented by the following expression supposing that a symbol E denotes an elasticity modulus, p denotes a density, h denotes a thickness and L denotes a length.

$$f = 1.03 \, h/L^2 \cdot \sqrt{E/\rho} \quad \text{[Expression 1]}$$

When the material is polycrystalline silicon, the elasticity modulus E is 160 GPa and the density ρ is $2.2 \times 10^3$ kg/m$^3$. Further, when the size is that L=40 μm and h=1.5 μm, the resonance frequency f is 8.2 MHz, whereby a filter with about 8 MHz band can be configured. When the mechanical resonance is employed, it is possible to obtain a sharp frequency selection characteristics with a high Q value as compared with a filter configured by a passive circuit such as a capacitor and a coil.

However, in the aforesaid configuration, there are the following restrictions in order to configure a filter with a higher frequency band. That is, as clear from the expression 1, firstly it is desirable to increase E/ρ by changing the material. However, when E is made larger, a displacement value of the beam becomes smaller even when a force for bending the beam is the same, whereby it becomes difficult to detect the displacement of the beam.

Further, when an index representing the degree of ease of bending the beam is expressed by a ratio d/L between a bending amount d at the center of the beam when applying a static load to the surface of the both-end-supported beam and the length L of the beam, the ratio d/L is expressed by the following proportional expression.

$$d/L \text{ is proportional to } L^3/h^3 \cdot 1/E \quad \text{[Expression 2]}$$

From this expression, in order to raise the resonance frequency while maintaining the value d/L, since at least E can not be changed, it is necessary to obtain the material with a low density ρ. Thus, as the material having almost the same Young's modulus as polycrystalline silicon and a low density, it is necessary to use composite material such as CFRP (Carbon Fiber Reinforced Plastics). In this case, it is difficult to constitute a fine mechanical vibration filter by the semiconductor process.

Thus, as a second method of not using such the composite material, there is a method of changing the size of the beam in the expression 1 to increase h/L$^2$. However, when the thickness h of the beam is made larger and the length L of the beam is made smaller, the index d/L of the expression 2 representing the degree of ease of bending becomes smaller and so it becomes difficult to detect the bending of the beam.

Figure 19:
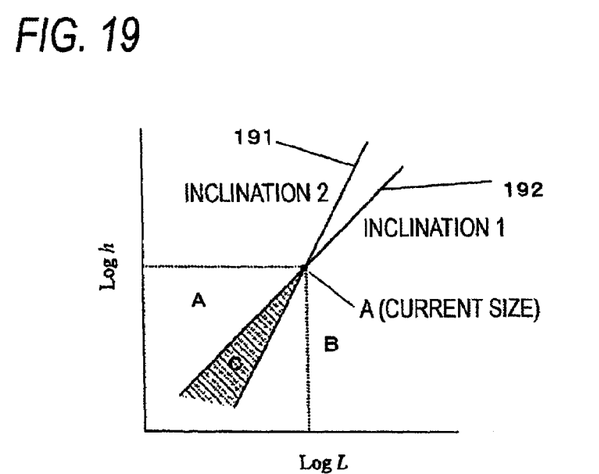
FIG. 19 is a characteristic diagram showing a relation between the size of the mechanical resonator and the high-frequency tendency in the related art.

FIG. 19 shows a relation between log(L) and log(h) in the expressions 1 and 2, in which a straight line 191 shows a relation obtained from the expression 1 and a straight line 192 shows a relation obtained from the expression 2. In FIG. 19, when values L and h in a range (area A) above the straight line of the inclination "2" which starts from the current size point A are selected, the value f becomes larger. In contrast, when values L and h in a range (area B) beneath the straight line of the inclination "1" are selected, the value d/L becomes larger. Thus, a hatched portion (area C) in the drawing represents an area of the values L and h which can increase the resonance frequency while securing the bending amount of the beam.

It is clear from FIG. 19 that it is a necessary condition to fine both the length L and the thickness h of the beam in order to realize the high-frequency characteristics of the mechanical vibration filter. Further, it a sufficient condition shown by the hatched portion in FIG. 19 to reduce the values L and h with the same scaling, that is, to reduce the values L and h along the straight line of the inclination "1".

In this manner, in the mechanical resonator of the related art, the resonance frequency can be made high by miniaturizing the size of the mechanical vibrator. However, in general, there is a problem that the mechanical Q value of the flexural vibration reduces when the size is miniaturized. As to this phenomenon, a non-patent document 2 shows a result in which the relation among a length and a thickness of a beam and a Q value of flexural resonance is measured by using a cantilever of mono-crystalline silicon. This non-patent document 2 shows that the Q value reduces by shortening the length of the beam and reducing the thickness of the beam. Thus, when the resonator using the flexural vibration according to the related art is miniaturized and applied to a filter, there arises a problem that a Q value necessary for obtaining the desired frequency selection characteristics may not be obtained.

Non-patent document 1: Frank D. Bannon III, John R. Clark, and Clark T-C. Nguyen, "High-QHF Microelectromechanical Filters", IEEE Journal of Solid-State Circuits, Vol. 35, No. 4, pp. 512-526, April 2000.

Non-patent document 2: K. Y Yasumura et al., "Quality Factors in Micron-and Submicron-Thick Cantilevers", IEEE Journal of Microelectromechanical Systems, Vol. 9, No. 1, March 2000.

DISCLOSURE OF THE INVENTION

Problems that the Invention is to Solve

Figure 20:
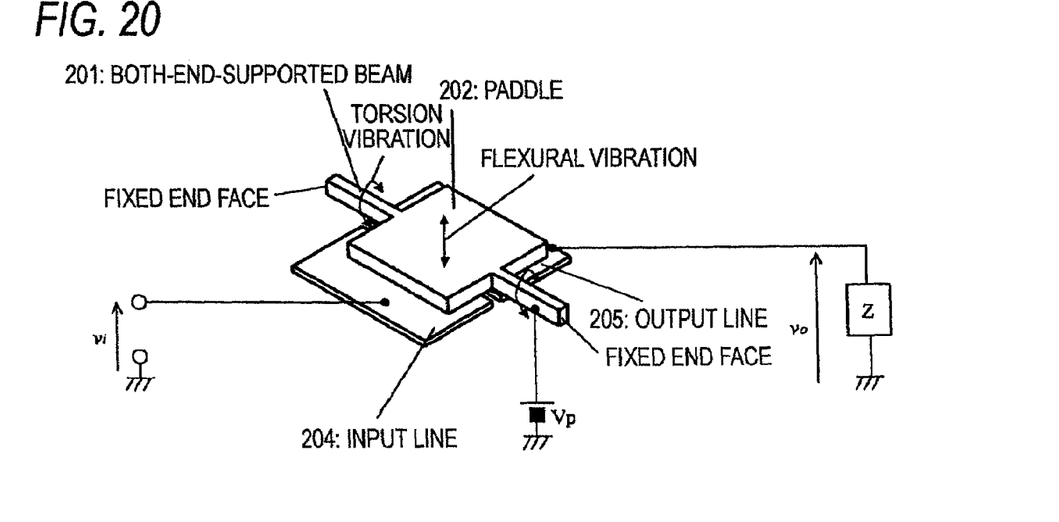
FIG. 20 is a diagram for explaining the torsion resonator having a paddle.

Thus, as a resonator with an excellent Q value, a torsion resonator using a torsion vibrator is considered. For example, as shown in FIG. 20, the torsion resonator shown in this drawing is arranged in a manner that a vibrator is excited by electrostatic power between an input line 204 and a paddle 202 by using the vibrator 201 having the paddle 202 at the center portion of a both-end-supported beam thereby to convert the change of an electrostatic capacity between an output line 205 and the paddle 202 into an electric signal.

However, in the case of applying such the torsion resonator to a filter of several GHz band used for a portable radio terminal, the resonance frequency of a vibrator having an additive mass such as the paddle 202 is low and so it is generally difficult to obtain the torsion resonance frequency of several GHz band.

Thus, it is considered to use the torsion vibration of a beam-type vibrator having a small paddle or no paddle. However, since a torsion moment due to the electrostatic power between the input line 204 and the paddle 202 becomes smaller and so a power for exciting the torsion vibration becomes smaller as the paddle is made smaller, it has been considered that is impossible to realize a beam-type vibrator having no paddle.

The inventors of the present invention invented from various kinds of experimentations that there is a shape and an arrangement which can make larger a force for exciting torsion vibration and make large a displacement by arranging an electrode suitably using a beam-type vibrator having no paddle.

The invention was made in view of the aforesaid circumstance and an object of the invention is to provide an electromechanical resonator which can perform an electromechanical conversion with a high efficiency.

MEANS FOR SOLVING THE PROBLEMS

In order to solve the aforesaid problems, a torsion resonator according to the invention is arranged in a manner that an electrode with an optimum shape is disposed via a gap at the side surface of a vibrator of a beam structure having no paddle in order to obtain high-frequency resonance.

According to this configuration, the electromechanical conversion can be performed with a high efficiency.

That is, the torsion resonator according to the invention is arranged in manner that in a torsion resonator serving as an electromechanical resonator including a vibrator for performing mechanical vibration and an electrode disposed near the vibrator, in which the vibrator is constituted so as to generate mechanical vibration in accordance with voltage change between the vibrator and the electrode, and electromechanical conversion is made possible between the voltage and the mechanical vibration, wherein the vibrator is configured by a beam structure and performs torsion vibration around a shaft along a longitudinal direction of the beam, and the electrode is disposed via a gap on a side surface of the vibrator of the beam structure to form an electrostatic capacitance between the vibrator and the electrode.

According to this configuration, the torsion resonator of a high frequency can be realized. The electromechanical resonator realizes a resonator which has an electromechanical conversion function for converting the voltage change between the vibrator and the electrode into the vibration of the vibrator or realizes the electromechanical conversion function for converting the change of the electrostatic capacitance between the vibrator and the electrode caused by the vibration of the vibrator into an electric signal generated at the electrode.

Further, the torsion resonator according to the invention includes one in which a portion where a size of the gap becomes minimum along a width direction of the side surface of the vibrator is smaller than the width of the side surface of the vibrator.

Figure 1A:
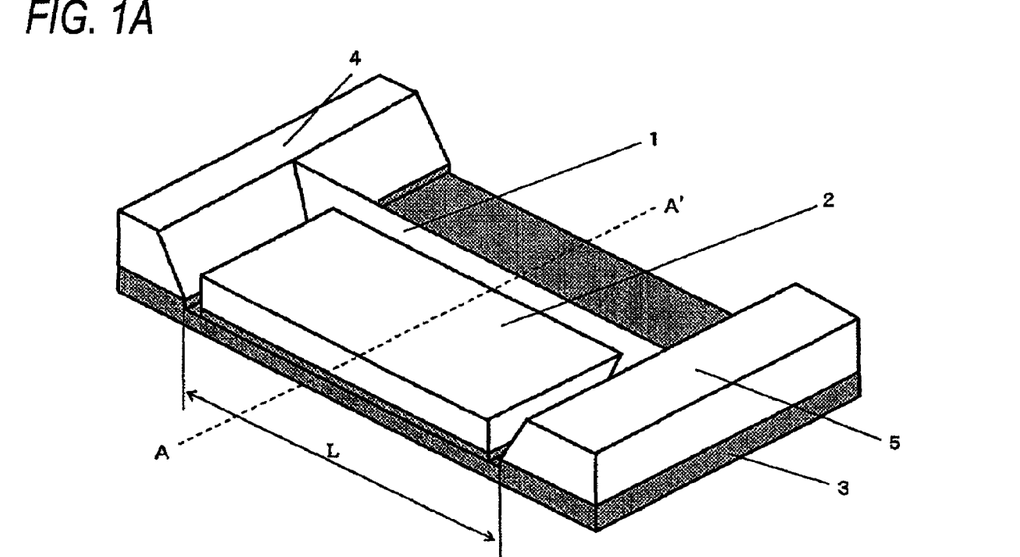
FIG. 1 shows a perspective view and a sectional view of the torsion resonator according to the first embodiment of the invention.
Figure 1B:
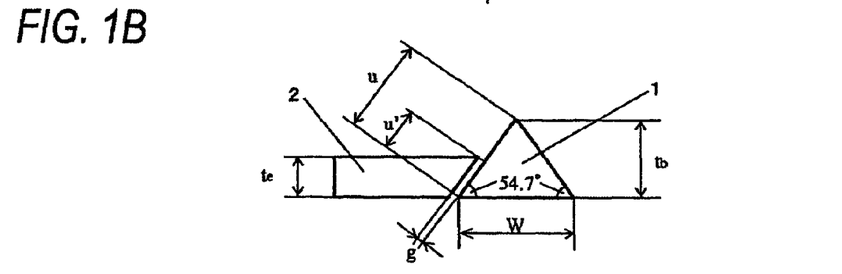

According to this configuration, a portion (u') at which the gap (g) becomes minimum along the width (u) direction of the side surface of the vibrator is set to be smaller than the width (u) of the side surface of the aforesaid vibrator (see FIG. 1(b)).

Further, the torsion resonator according to the invention includes one in which as to the capacitance C between the vibrator and the electrode and a displacement amount x due to torsion vibration of the vibrator, a shape and a position of the electrode are adjusted in accordance with a shape of the vibrator so that $\Delta C/\Delta x$ becomes maximum.

According to this configuration, a ratio of converting an AC voltage between the vibrator and the electrode into an exciting force due to the electrostatic force can be made maximum and so a large amplitude of the vibration can be obtained. Alternatively, a ratio of converting the vibration speed of the vibrator into a current generated at the electrode can be made maximum.

Further, the torsion resonator according to the invention includes one in which as to the capacitance C between the vibrator and the electrode and a displacement amount x due to torsion vibration of the vibrator, a shape and a position of the electrode are adjusted in accordance with a shape of the vibrator so that $(\Delta C/\Delta x)^2/C$ becomes maximum.

According to this configuration, a changing ratio of the capacitance per unit AC voltage can be made maximum at the resonance point.

Further, the torsion resonator according to the invention includes one in which as to the capacitance C between the vibrator and the electrode and a displacement amount x due to torsion vibration of the vibrator, a value is between the electrode adjusted so that $(\Delta C/\Delta x)^2/C$ becomes maximum and the electrode adjusted so that $\Delta C/\Delta x$ becomes maximum.

According to this configuration, each of the conversion ratio between the voltage and the electrostatic force, the conversion ratio between the vibration speed and the current and the changing ratio of the capacitance per unit AC voltage at the resonance point can be made maximum.

Further, the torsion resonator according to the invention includes one in which the capacitance C between the vibrator and the electrode is adjusted in accordance with a ratio of a thickness of the electrode with respect to a thickness of the beam.

According to this configuration, the capacitance C between the vibrator and the electrode can be adjusted easily by adjusting the thicknesses of the vibrator and the electrode using the thin film forming technique.

Further, the torsion resonator according to the invention includes one in which a sectional shape of the beam structure is a polygon.

According to this configuration, since the sectional shape of the beam structure is a polygon, that is, a rod-shaped member having a rotation asymmetrical portion in which the distance from the axle center of the beam structure to the periphery is not constant, the electrostatic capacitance changes in accordance with the rotation and so the excitation of the torsion vibration can be performed by the electrode and the detection of the torsion vibration can be performed by the electrode.

Further, the torsion resonator according to the invention includes one in which a sectional shape of the beam structure is an ellipse.

According to this configuration, since the sectional shape of the beam structure is an ellipse, that is, a rod-shaped member having a rotation asymmetrical portion in which the distance from the axle center of the beam structure to the periphery is not constant, the electrostatic capacitance changes in accordance with the rotation and so the excitation of the torsion vibration can be performed by the electrode and the detection of the torsion vibration can be performed by the electrode.

Further, the torsion resonator according to the invention includes one in which the beam structure is formed by monocrystalline material and the side surface of the beam is a crystal orientation surface formed by anisotropic etching.

According to this configuration, the beam structure can be manufactured by using the etching technique having the property that the etching speed differs as to respective crystal orientations, and so the fine beam structure having a smooth surface shape can be formed.

Further, the torsion resonator according to the invention includes one in which the beam structure is formed by monocrystalline silicon and a section of the beam has a triangular or trapezoidal shape surrounded by {100} and {111} surfaces.

According to this configuration, by introducing the anisotropic etching using a silicon substrate as a general semiconductor material, the shape can be processed with good controllability according to the usual semiconductor process, whereby the torsion resonator can be configured.

Furthermore, the torsion resonator according to the invention includes one in which a plurality of the electrodes are provided in accordance with a torsion resonance mode number of the vibrator.

According to this configuration, the torsion resonator utilizing not only the torsion basic mode frequency but also the resonance frequency of the high order mode can be configured.

Furthermore, the torsion resonator according to the invention includes one in which a plurality of the torsion resonators electrically disposed in parallel are provided.

Furthermore, the torsion resonator according to the invention includes one in which an amplifier is constituted in a manner that the beam structure is formed by monocrystalline semiconductor material, a supporting portion formed by an impurity diffusion region of a conductive type in opposite to that of the vibrator is provided at each of both ends of the vibrator, the vibrator constituted by the beam structure is formed as a channel, and the supporting portions formed by the impurity diffusion regions is formed as a source region and a drain region, respectively.

Furthermore, the torsion resonator according to the invention includes one in which the torsion resonator is housed in a case within which the atmosphere is sealed in a vacuum state.

Furthermore, the filter according to the invention includes one which uses the aforesaid torsion resonator.

EFFECTS OF THE INVENTION

According to this configuration of the torsion resonator according to the invention, a filter can be provided which has a high Q value and can be used in a range of several hundred MHz to several GHz.

EXPLANATION OF SYMBOLS 1, 11, 21, 41, 51 vibrator
2 electrode
3 insulator
4 source region
5 drain region 30 silicon substrate
31 silicon oxide layer
32 monocrystalline silicon layer
33 silicon nitride layer
35 silicon oxide layer
101, 102 vibrator of a both-end-supported beam type
103 coupling beam
104 input line
105 output line
191 a straight line representing relation between length L and thickness h having the same frequency
192 a straight line representing relation between length L and thickness h having the same index representing the degree of ease of bending
201 vibrator
202 paddle
204 input line
205 output line

BEST MODE FOR CARRYING OUT THE INVENTION

Hereinafter, an embodiment of the invention will be explained in detail with reference to the drawings.

First Embodiment

FIG. 1(a) is a perspective view showing the main portion of a torsion resonator according to the first embodiment of the invention. The torsion resonator according to the first embodiment includes a beam-type vibrator 1 for performing torsion vibration and an electrode 2 disposed in adjacent to the side surface of the beam-type vibrator 1 via a gap.

In this case, the beam-type vibrator 1 is a both-end-supported beam having a constant section and fixed at its both ends. That is, the beam-type vibrator 1 is configured to have no paddle and the material thereof is monocrystalline silicon. The beam-type vibrator has a length L of 1.6 µm and further has a torsion vibration basic mode of 1.2 GHz.

FIG. 1(b) is a sectional view showing the beam-type vibrator 1 and the electrode 2 cut along a line A-A' in FIG. 1(a). The sectional shape of the beam-type vibrator 1 is an isosceles triangle which has a thickness tb of 200 nm and a width W of 284 nm. An angle at each of the both end corers of the bottom side of the isosceles triangle is 54.7 degrees. A gap g of 10 nm is provided between the beam-type vibrator 1 and the electrode 2 thereby to form an electrostatic capacitance C. The bottom surface of the electrode 2 is positioned at the same height as the bottom surface of the beam-type vibrator 1 and the electrode is set to have a thickness te of 0.12 µm.

Next, the reason why the thickness te of the electrode 2 is set to 0.12 µm will be explained with reference to FIG. 2. For the sake of convenience of the explanation, in FIG. 2, the electrode 2 in FIG. 1(a) is further provided at such a position that the two electrodes are disposed symmetrically so as to sandwich the beam-type vibrator 1 therebetween thereby to perform the voltage-to-mechanical vibration-to-current conversion by the single vibrator and the two electrodes.

When a DC voltage Vp and an input AC voltage v are applied in an superimposed manner between the electrode 2a and the beam-type vibrator 1, an electrostatic force F having the frequency of the AC signal v and applied to the beam-type vibrator is represented by the following expression.

$$F = v \cdot Vp \cdot \Delta C / \Delta x$$

In this expression, C denotes an electrostatic capacitance between the electrode 2a and the beam-type vibrator 1 and x denotes a displacement amount due to the torsion vibration of the beam-type vibrator 1. This expression represents that the electrostatic force F can be made maximum when the electrostatic capacitance C is determined so that $\Delta C / \Delta x$ becomes maximum.

Figure 2:
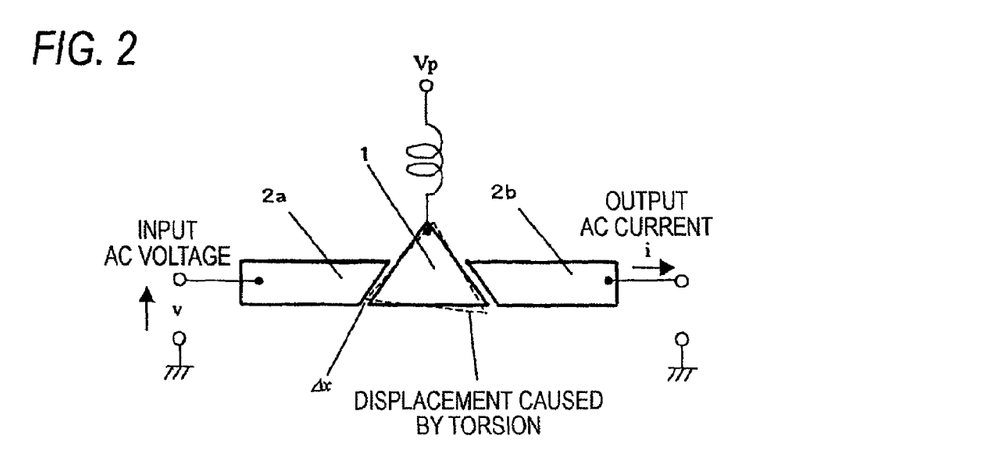
FIG. 2 is an explanatory diagram of the electromechanical conversion of the torsion resonator according to the first embodiment of the invention.

Further, in FIG. 2, an AC current i generated at an output electrode 2b by the beam-type vibrator in a torsion vibrating state is represented by the following expression.

$$i = Vp \cdot (dx/dt) \cdot \Delta C / \Delta x$$

This expression represents that the current i can be made maximum when the electrostatic capacitance C is determined so that $\Delta C / \Delta x$ becomes maximum.

Figure 3:
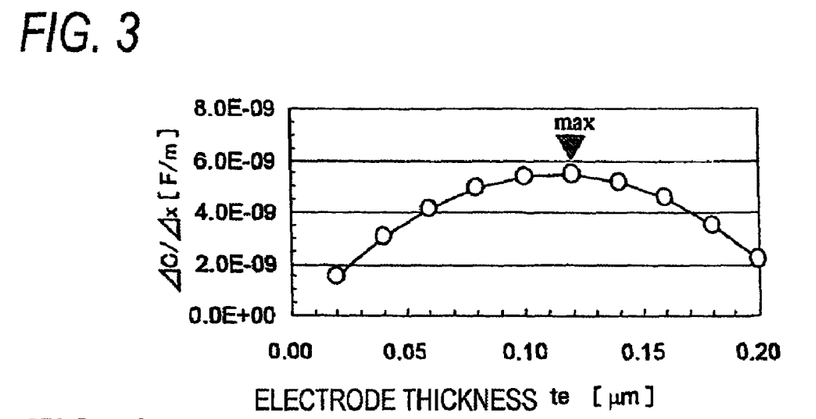
FIG. 3 is a diagram showing a relation between an electrode thickness and $\Delta C/\Delta x$ in a case of a vibrator having a beam of a triangular section.

FIG. 3 shows a relation between the electrode thickness te and $\Delta C / \Delta x$. When te is 0.12 µm, $\Delta C / \Delta x$ becomes maximum. Thus, when te is set to be 0.12 µm, the resonator excellent in the voltage-to-force conversion factor or the vibration speed-to-current conversion factor can be configured.

Figure 4:
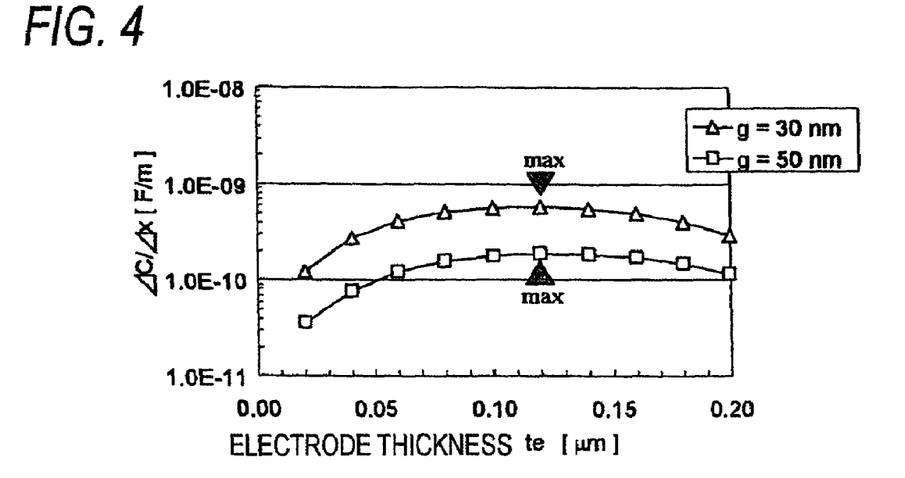
FIG. 4 is a diagram showing a relation between an electrode thickness and $\Delta C/\Delta x$ in a case of enlarging a gap.

FIG. 4 shows a relation between the electrode thickness te and $\Delta C / \Delta x$ when the gap g is set to be larger than 10 nm, for example, 30 nm or 50 nm. In each of the respective gaps, $\Delta C / \Delta x$ can be made maximum when te is set to be 0.12 µm, whereby the resonator excellent in the voltage-to-force conversion factor or the vibration speed-to-current conversion factor can be configured.

Next, the explanation will be made with reference to FIGS. 5 and 6 as to the method of manufacturing the torsion resonator according to the first embodiment of the invention. Each of these drawings shows a section corresponding to the section cut along the line A-A' in FIG. 1(a). An SOI (Silicon on Insulator) substrate is used in which a monocrystalline silicon layer 32 as a device forming layer having a desired carrier density is laminated on the surface of a silicon substrate 30 via an oxide film 31 constituted by an oxide silicon film. In order to form a beam structure at the monocrystalline silicon layer 32 at the upper portion of the SOI substrate, the processing technique called the anisotropic etching is partially utilized which is introduced in a non-patent document 3 and also utilized for generating a quantum wire.

Figure 5A:
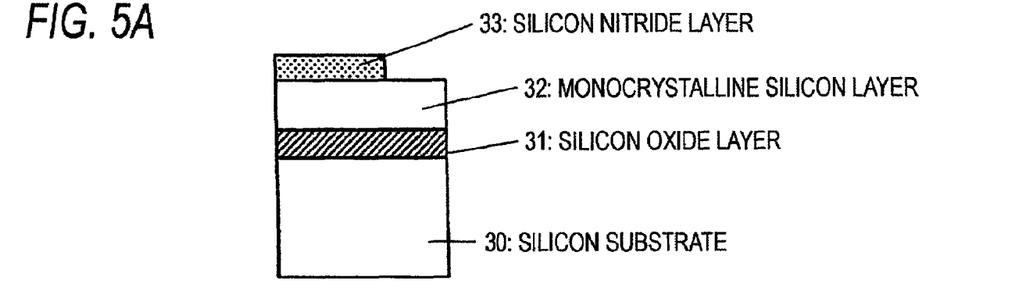
FIG. 5 is diagrams for explaining the manufacturing method of the torsion resonator according to the first embodiment of the invention.

First, a silicon nitride film 33 is formed on the SOI substrate and then subjected to the patterning (FIG. 5(a)). In this case, the patterned edge is formed so as to be along {110} of the silicon layer 32.

Figure 5B:
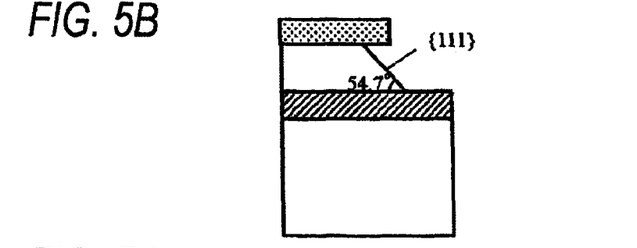

Then, the silicon layer 32 is subjected to the anisotropic etching by using KOH. Since the etching rate of the {111} surface is quite smaller than that of other surfaces, the etching proceeds consequently in a manner that the {111} surface is exposed as shown in FIG. 5(b). In this case, {111} and {100} have a positional relation of 54.7 degrees therebetween.

Then, the silicon layer is oxidized on a state that the upper surface thereof is covered by the silicon nitride film 33 to protect the {111} surface locally by the silicon oxide film 35. Then, the silicon nitride film 33 used as a mask is subjected to the patterning again.

Figure 5C:
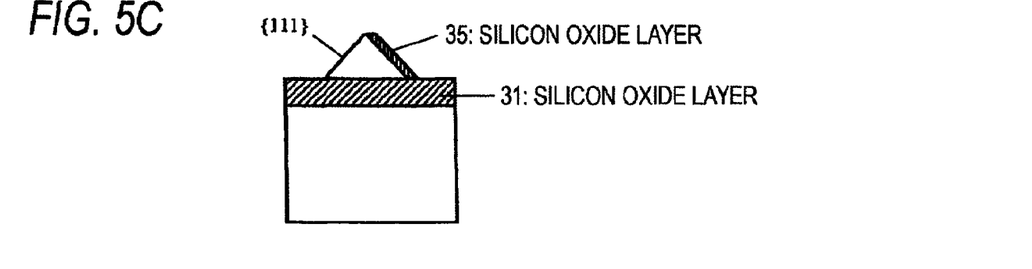

Then, the silicon layer 32 is again subjected to the anisotropic etching by using the KOH to obtain a silicon beam structure having a triangular section as shown in FIG. 5(c).

Next, the $SiO_2$ is processed by the RIE (reactive ion etching) using $CHF_3$ gas. In this case, since the silicon beam structure having a triangular section serves as a mask, the SiO2 beneath the beam remains without being etched away.

Figure 5D:
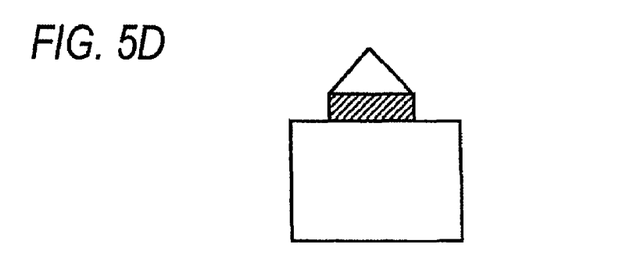
Figure 5E:
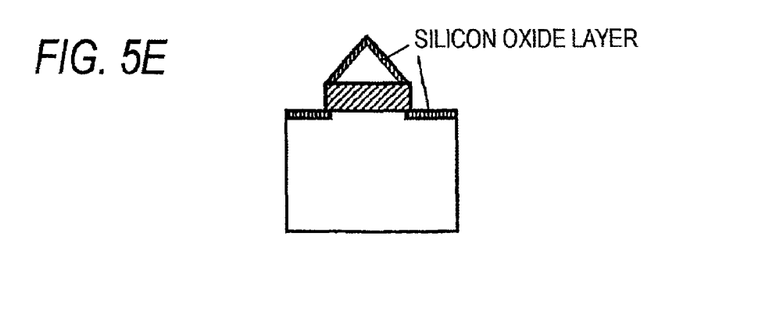

Next, in order to form a sacrificial layer which finally constitute a gap between the beam and the electrodes, $SiO_2$ is formed or the surface of the silicon beam structure having a triangular section is oxidized. FIG. 5(e) shows a state where the surface of the silicon is oxidized within an oxidizing furnace in accordance with the latter method.

Figure 6A:
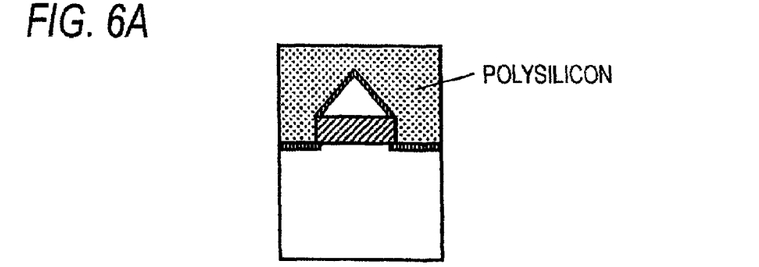
FIG. 6 is diagrams for explaining the manufacturing method of the torsion resonator according to the first embodiment of the invention.
Figure 6B:
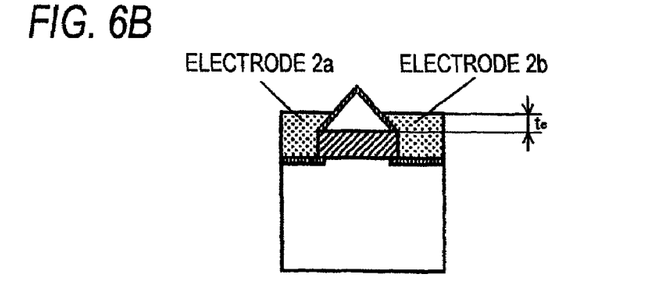

Polysilicon serving as the electrodes is deposited by the CVD (Chemical Vapor Deposition) (FIG. 6(a)), and then the Polysilicon is etched back by the RIE using $CF_4$ gas to adjust the electrode thickness te as shown in FIG. 6(b).

Finally, the $SiO_2$ between the beam and the electrodes and the $SiO_2$ at the bottom surface of the beam are removed by using hydrofluoric acid thereby to place the beam in a movable state.

Figure 6C:
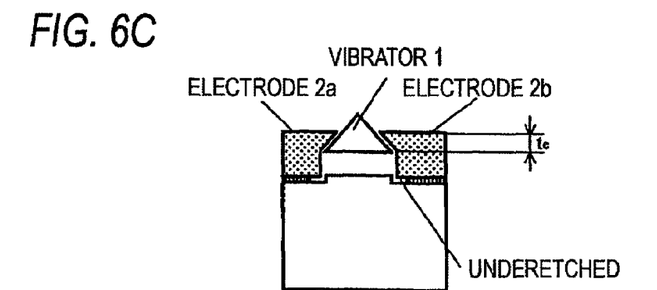

Although the electrodes 2 also exist at the lower portion than the bottom surface of the vibrator 1, the substantial capacitance between the vibrator 1 and the electrodes 2 is formed by a portion within the thickness te of the electrodes 2. In order not to generate the portion of the electrodes 2 existing lower than the bottom surface of the vibrator 1, it is considered to eliminate the process of FIG. 5(d) and form the electrodes 2 on the $SiO_2$ layer 31. However, when the $SiO_2$ layer 31 is removed by using hydrofluoric acid in the process of FIG. 6(c), the portions below the electrodes 2 are also removed and so an amount of the under etching increases remarkably, whereby the electrodes also have flexibility. In this case, since the vibrator 1 and the electrodes 2 may be fixed firmly to each other due to the electrostatic force therebetween. Thus, the elimination of the process of FIG. 5(d) is effective only when the electrostatic force is quite small.

The anisotropic etching may be performed by using TMAH (Tetramethy Ammonium Hydroxide) in place of KOH.

Non-patent document 3: G Hashiguchi and H. Mimura, "Fabrication of Silicon Quantum Wires Using Separation by Implanted Oxygen Wafer", Jpn. J. Appl. Phys. Vol. 33 (1994), pp. L1649-1650.

The process shown in FIGS. 5 and 6 is effective for manufacturing a fine resonator in a range of several hundred MHz to several GHz since a structure having the fineness exceeding the limit of the patterning width in the semiconductor process.

Further, the side surfaces of the beam have quite smooth surface property sine these side surfaces are formed by the crystalline plane of silicon, and so the vibrator can be obtained in which the surface loss due to vibration is reduced and the Q value is high.

Figure 7:
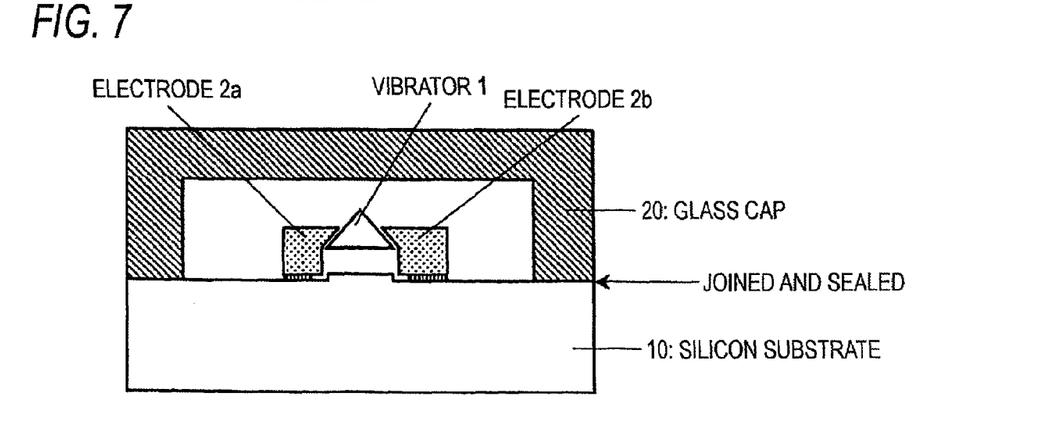
FIG. 7 is a diagram showing a modified example of the torsion resonator according to the first embodiment of the invention.

Further, like an example shown in FIG. 7, the torsion resonator may be housed in a case within which the atmosphere is sealed in a vacuum state. In this case, the vibrator 1 having a triangular section and the electrodes 2a, 2b surrounding the vibrator, each formed on a silicon substrate 10 serving as a base, are covered by a glass cap 20 having a recess portion and the air within the recess portion is evacuated so as to be vacuum. The glass cap and the abutment portion of the silicon substrate are directly joined by means of the anodic bonding.

Alternatively, the silicon substrate may be processed in its shape so that the vibrator of the beam structure and the electrodes are formed within a cavity formed on the surface of the silicon substrate and the surface of the silicon substrate may be covered by a glass plate. According to this configuration, the torsion resonator having high protective properties can be formed.

Further, the explanation will be made as to the configuration for extracting and amplifying the output signal from the torsion resonator according to the embodiment. This configuration is same as that shown in FIG. 1. However, the vibrator 1 is an N-type semiconductor, in which one of the both end supporting portions of the vibrator is a source region 4 formed by a p+ diffusion region and the other end thereof is a drain region 5 formed by a p+ diffusion region. The electrode is formed by polycrystalline silicon. That is, the entirety of the torsion resonator is a p-channel MOS transistor, in which the oxide film of the MOS structure is replaced by a gap thereby to make it possible to vibrate the vibrator 1. The vibrator 1 is applied with an electrostatic force generated between the vibrator and the gate electrode 2 to vibrate with a large amplitude near the resonance frequency to apply modulation to the channel forming within the vibrator 1 thereby to obtain a drain current due to the modulation. According to such the configuration, as compared with the case of separately forming a resonator and an amplifier and coupling them with a wire to each other, the element can be miniaturized, and a loss due to the wiring and the degree of superimposition of noises can be reduced.

A gate-vibration type MOSFET for vibrating a gate has been thought of. However, since polycrystalline silicon or a metal thin film is usually used as the gate material, loss of vibration energy occurs at the crystalline interface, and hence a resonator with a high Q value can not be constituted. In contrast, when the vibrator is formed by monocrystalline silicon in this manner, the vibrator corresponding to a channel constituted by the monocrystalline silicon vibrates, the vibrator and the amplifier with a high Q value can be realized.

Second Embodiment

Next, the second embodiment of the invention will be explained.

Figure 8A:
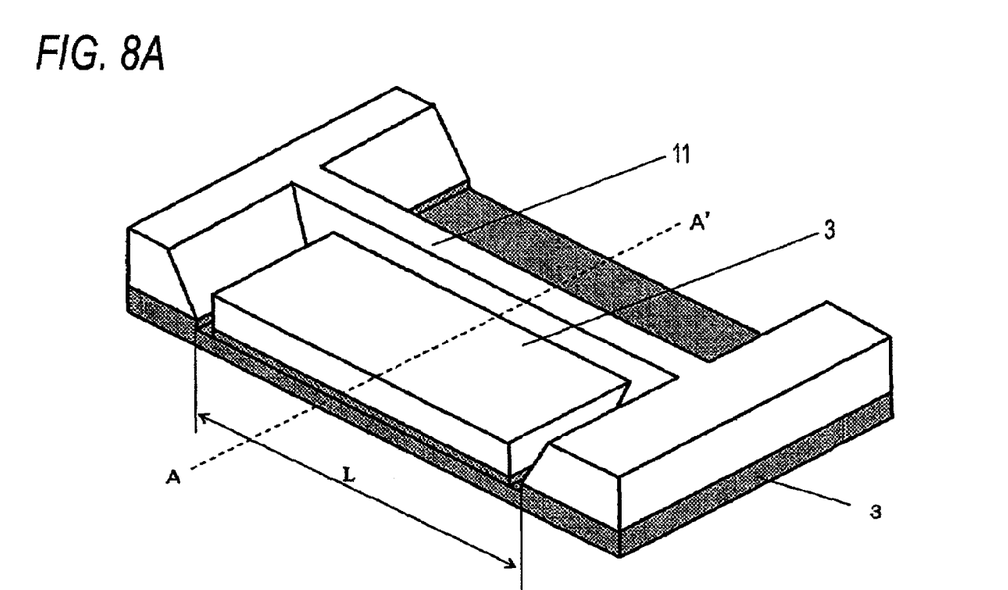
FIG. 8 shows a perspective view and a sectional view of the torsion resonator according to the second embodiment of the invention, in a case of a vibrator having a beam of a trapezoidal section.
Figure 8B:
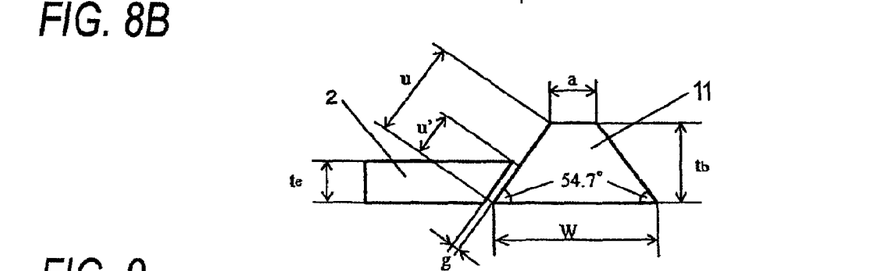
Figure 9:
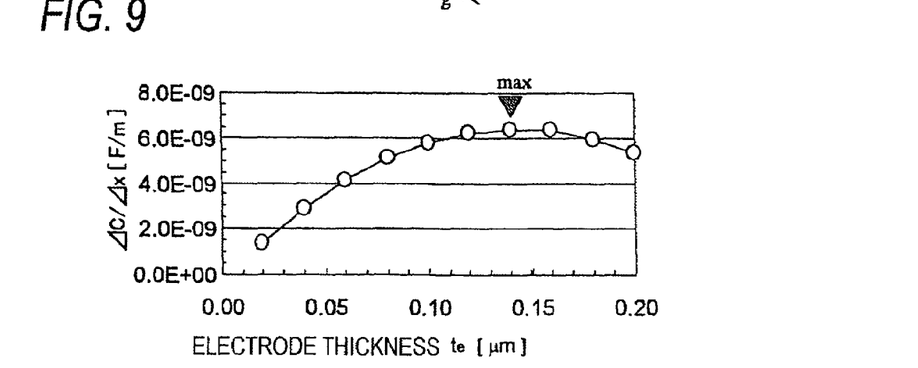
FIG. 9 is a diagram showing a relation between an electrode thickness and $\Delta C/\Delta x$ in a case where a is 100 nm in the configuration of FIG. 8.

The sectional shape of the beam is not necessarily a triangular shape but may be a trapezoidal shape. FIG. 8(a) is a perspective view showing a torsion resonator having a beam of a trapezoidal section, and FIG. 8(b) is a sectional diagram cut along a line A-A' in FIG. 8(a). The beam-type vibrator 11 is formed by monocrystalline silicon as its material and has a length L of 1.6 µm and further has a torsion vibration basic mode of 1.3 GHz. Further, the vibrator has a thickness tb of 200 nm and a width W of 384 nm. The upper side a of the trapezoid is 100 nm and an angle at each of the both end corers of the bottom side thereof is 54.7 degrees. A gap g of 10 nm is provided between the beam-type vibrator 11 and the electrode 2 thereby to form an electrostatic capacitance C. The bottom surface of the electrode 2 is positioned at the same height as the bottom surface of the beam-type vibrator 11 and the electrode is set to have a thickness te of 0.14 µm. This is because in the relation between the electrode thickness te and $\Delta C/\Delta x$, $\Delta C/\Delta x$ becomes maximum when te is 0.14 µm, as shown in FIG. 9. Thus, when te is set to be 0.14 µm, the resonator excellent in the voltage-to-force conversion factor or the vibration speed-to-current conversion factor can be configured. That is, a portion (u') at which the gap (g) becomes minimum along the width (u) direction of the side surface of the vibrator is smaller than the width (u) of the side surface of the aforesaid vibrator.

When the beam-type vibrator 11 having a trapezoidal section is arranged in a manner that the upper side a of the trapezoid is 200 nm and a width W is 384 nm, the vibrator having the torsion vibration basic mode of 1.2 GHz is obtained. However, as clear from the relation between the electrode thickness te and ΔC/Δx shown in FIG. 10, when te is set to be 0.16 μm, the resonator excellent in the voltage-to-force conversion factor or the vibration speed-to-current conversion factor can be configured.

Figure 10:
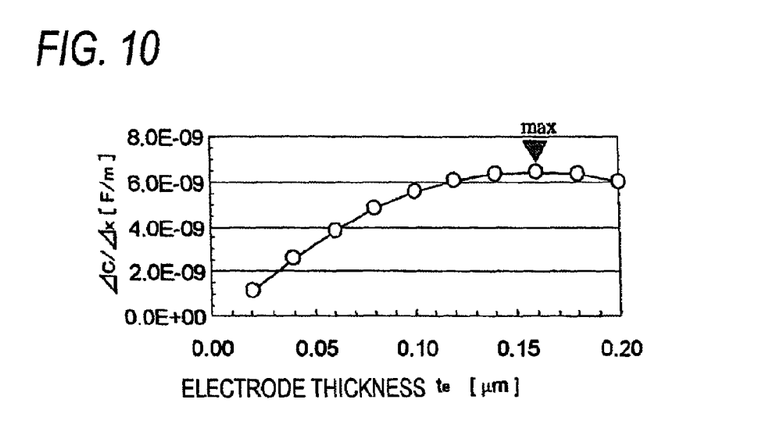
FIG. 10 is a diagram showing a relation between an electrode thickness and $\Delta C/\Delta x$ in a case where a is 200 nm in the configuration of FIG. 8.

In the case where the thickness tb of the vibrator 1 is same and the gap g is same, the relation between the electrode thickness te and ΔC/Δx was investigated as to three kinds of sectional shapes of a triangle, a trapezoid (a=100 nm) and another trapezoid (a=200 nm). It was clarified as shown in FIGS. 3, 9 and 10 that the optimum electrode thickness te approaches the thickness tb of the vibrator when the trapezoid having the wider upper side is employed. When this property is utilized, in the manufacturing process shown in FIGS. 5 and 6, the process of FIG. 6(b), that is, the etchback process of the material of the electrodes 2 can be facilitated advantageously. This is because, when the etchback process is performed while observing the surface of a wafer and is stopped at a timing where the vibrator 11 is confirmed, the thickness tb of the vibrator can be made substantially same as the electrode thickness te.

Figure 11A:
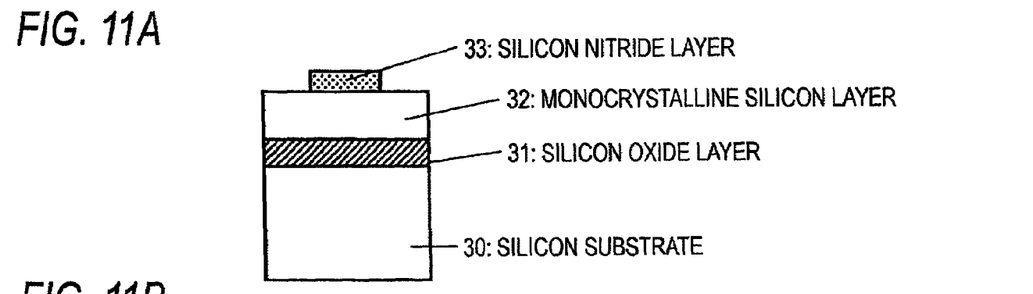
FIG. 11 is diagrams for explaining the manufacturing method of the torsion resonator according to the second embodiment of the invention, in a case of a vibrator having a beam of a trapezoidal section.
Figure 11B:
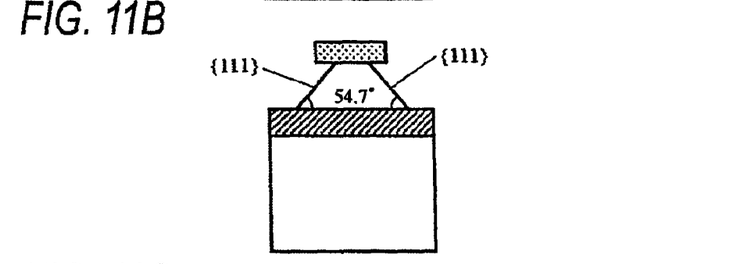
Figure 11C:
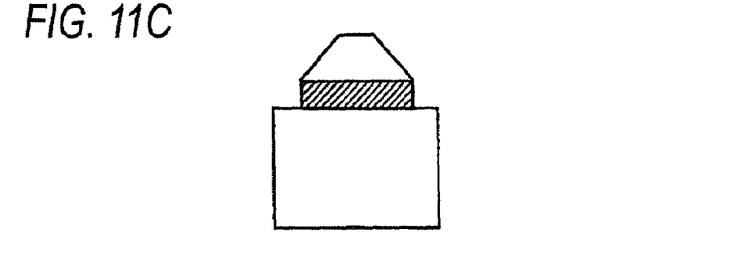

The manufacturing process of this beam having the trapezoidal section is shown in FIG. 11. This process uses an SOI substrate like the case of the beam having the triangular section.

First, a silicon nitride film 33 is formed on the SOI substrate which is configured by laminating a silicon layer 32 on a monocrystalline silicon substrate 30 as a base layer via a silicon oxide layer 31, and the silicon nitride film 33 is subjected to the patterning (FIG. 11(a)). In this case, the patterned edge is formed so as to be along {110} of the silicon layer 32.

Then, the silicon layer 32 is subjected to the anisotropic etching by using KOH. Since the etching rate of the {111} surface is quite smaller than that of other surfaces, the etching proceeds consequently in a manner that the {111} surface is exposed as shown in FIG. 11(b).

Next, the $SiO_2$ is processed by the RIE (reactive ion etching) using $CHF_3$ gas. In this case, since the silicon beam structure having a triangular section serves as a mask, the $SiO_2$ beneath the beam remains without being etched away. The succeeding process is same as that of FIG. 5(e) and FIG. 6.

The process shown in FIG. 11 is effective for manufacturing a fine resonator in a range of several hundred MHz to several GHz since a structure having the fineness exceeding the limit of the patterning width in the semiconductor process.

Further, the side surfaces of the beam have quite smooth surface property sine these side surfaces are formed by the crystalline plane of silicon, and so the vibrator can be obtained in which the surface loss due to vibration is reduced and the Q value is high.

Third Embodiment

Figures 12A, 12B:
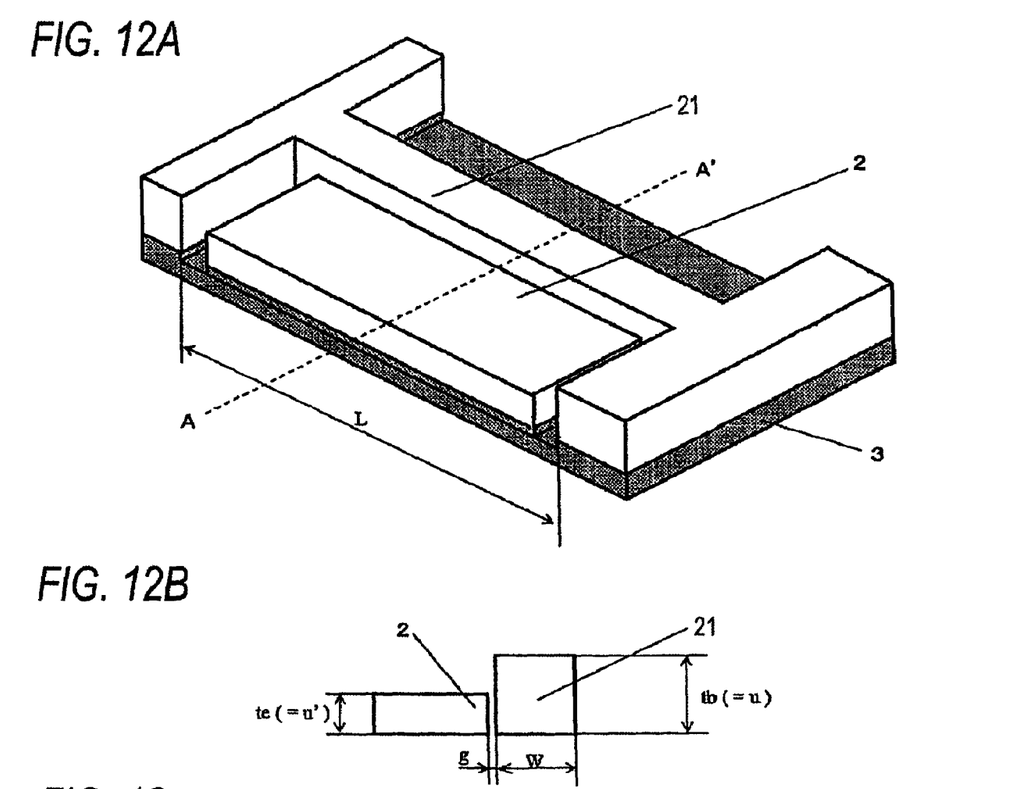
FIG. 12 shows a perspective view and a sectional view of the torsion resonator according to the third embodiment of the invention, in a case of a vibrator having a beam of a square section.
Figure 13:
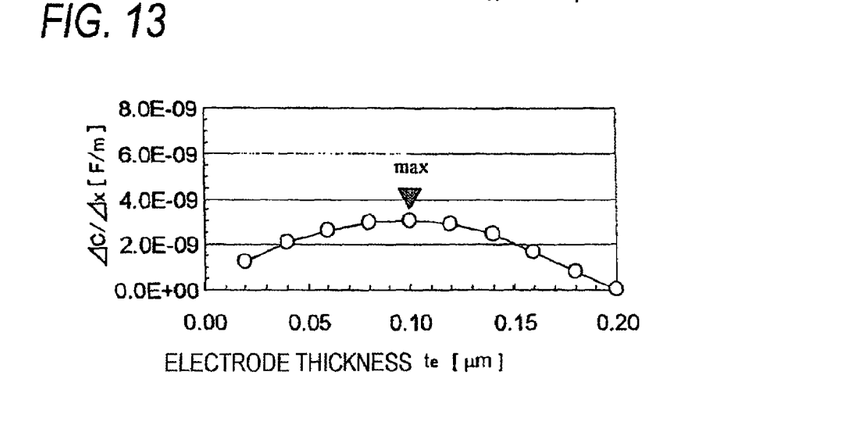
FIG. 13 is a diagram showing a relation between an electrode thickness and $\Delta C/\Delta x$ in the configuration of FIG. 12.

The optimum electrode thickness te can be set even when the vibrator is arranged to have a regular tetragonal section as shown in FIG. 12. The beam-type vibrator 21 according to the third embodiment is formed by monocrystalline silicon as its material and has a length L of 1.6 μm and further has a torsion vibration basic mode of 1.5 GHz. Further, the vibrator has a thickness tb of 200 nm and a width W of 200 nm. A gap g of 10 nm is provided between the beam-type vibrator 21 and the electrode 2 thereby to form an electrostatic capacitance C. The bottom surface of the electrode 2 is positioned at the same height as the bottom surface of the beam-type vibrator 21 and the electrode is set to have a thickness te of 0.10 μm. This is because in the relation between the electrode thickness te and ΔC/Δx, ΔC/Δx becomes maximum when te is 0.10 μm, as shown in FIG. 13. Thus, when te is set to be 0.10 μm, the resonator excellent in the voltage-to-force conversion factor or the vibration speed-to-current conversion factor can be configured.

However, when FIG. 13 is compared with the cases of the triangular section (FIG. 3) and the trapezoidal section (FIGS. 9 and 10) each having the same gap g of 10 nm, the absolute value of ΔC/Δx in the case of the square section is minimum. Not apply only to the regular tetragon, when the number of n increases in a regular polygon having n planes, the sectional shape thereof approaches a circle. In this case, the sectional shape of the regular polygon remains a circle even when the torsion vibration occurs, whereby it becomes difficult both to apply a torsion exciting force by the electrode and detect the torsion vibration by the electrode.

When the resonator according to the embodiment of the invention is sealed in a vacuum state, the resonator with a high Q value can be provided in which the vibration of the vibrator is not influenced by the viscosity of the air.

Further, although the embodiment employs a both-end-supported beam as the torsion vibrator, the embodiment is not limited to the both-end-supported beam and a cantilever may be used as the torsion vibrator.

Further, since the resonator shown in the embodiment of the invention has a high capacitive impedance, a plurality of the resonators may be suitably coupled in parallel so as to reduce the total impedance thereby to efficiently transmit input electric energy to the resonators.

Figure 14:
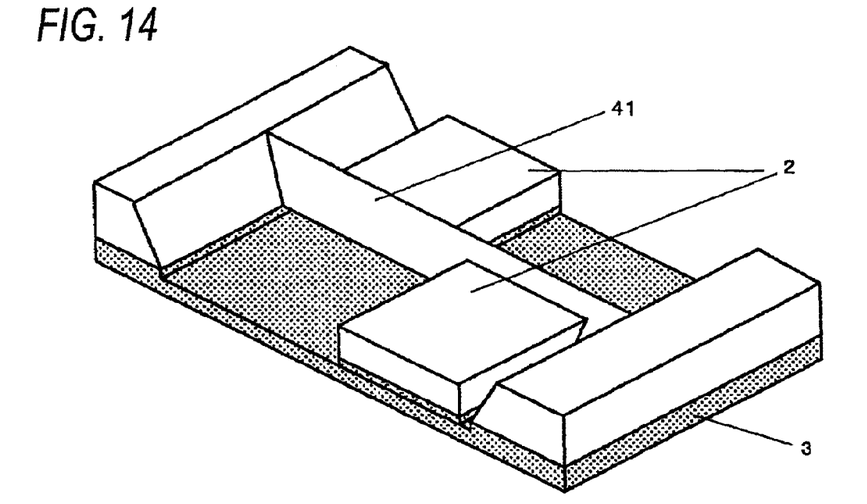
FIG. 14 shows a perspective view of the torsion resonator using high-order torsion vibration according to the third embodiment of the invention.

Further, FIG. 14 is a perspective view showing a torsion resonator using the secondary torsion mode of a beam-type vibrator 41 having a triangular section. In this manner, a plurality of electrodes each thickness being suitably adjusted according to the mode number may be disposed.

Fourth Embodiment

Next, the fourth embodiment of the invention will be explained.

This embodiment relates to a method of adjusting a capacitance so that a capacitance change ratio per unit AC voltage between a vibrator and an electrode becomes maximum at the time of resonance of the vibrator. A displacement x of the vibrator at the time of the resonance is represented by the following expression.

$$X = Q/k \cdot (\Delta C/\Delta x) \cdot v \cdot Vp$$

Thus, the capacitance change ratio per unit AC voltage is represented by the following expression.

$$(\Delta C/\Delta x)/C = Q/k \cdot (\Delta C/\Delta x)^2/C \cdot Vp$$

In this expression, Q denotes a mechanical Q value of the vibrator and k denotes a spring constant. Thus, when $(\Delta C/\Delta x)^2/C$ is set to be larger, the resonator can be configured which has an ability of changing largely its electrostatic capacitance at the time of resonance even when the AC voltage is the same.

Figure 15:
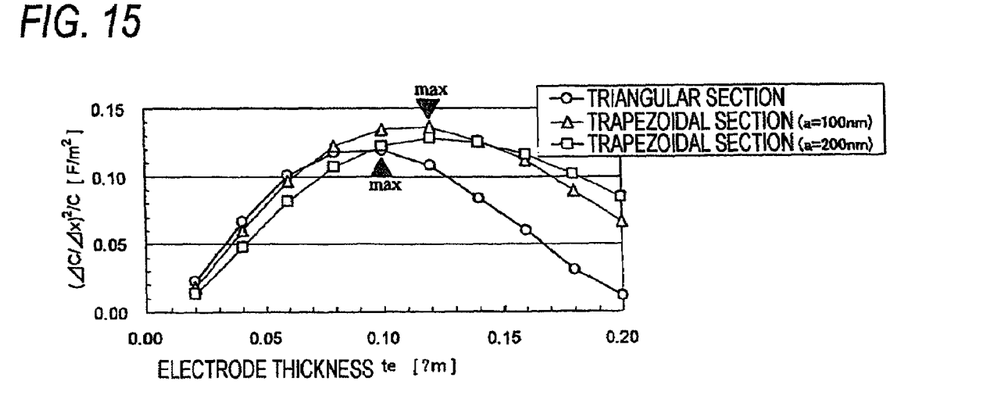
FIG. 15 is a diagram showing a relation among the sectional shape of a beam, an electrode thickness and $(\Delta C/\Delta x)^2/C$ in the fourth embodiment of the invention.

FIG. 15 is a graph showing the relation between the electrode thickness te and $(\Delta C/\Delta x)^2/C$ as to the case using the same material and size of the torsion resonator shown in the first embodiment, that is, the case of the beam vibrator having the triangular section shown in FIG. 1(b) and the case of the trapezoidal section (a=100 nm, 200 nm) shown in FIG. 8(b).

A table 1 collectively shows the electrode thicknesses te where $\Delta C/\Delta x$ become maximum shown in the first embodiment, and the electrode thicknesses te where $(\Delta C/\Delta x)^2/C$ become maximum obtained from FIG. 15 in this embodiment. The electrode thicknesses te where $\Delta C/\Delta x$ become maximum differ slightly from the electrode thicknesses te where $(\Delta C/\Delta x)^2/C$ become maximum.

TABLE 1

|  | electrode thicknesses te [μm] where $\Delta C/\Delta x$ become maximum | electrode thicknesses te [μm] where $(\Delta C/\Delta x)^2/C$ become maximum |
| --- | --- | --- |
| Vibrator with triangular section (FIG. 1) tb = 200 nm, g = 10 nm | 0.12 | 0.10 |
| Vibrator with trapezoidal section (FIG. 8) tb = 200 nm, a = 100 nm g = 10 nm | 0.14 | 0.12 |
| Vibrator with trapezoidal section (FIG. 8) tb = 200 nm, a = 200 nm g = 10 nm | 0.16 | 0.12 |

The selection criterion for the electrode thicknesses te according to the first embodiment and the selection criterion for the electrode thicknesses te according to this embodiment are selectively employed in accordance with the usage. In the first embodiment, although the maximum exciting force, the maximum vibration amplitude and the maximum generation current can be obtained, the electrode is required to have a thickness slightly larger than the optimum electrode thicknesses te of this embodiment, that is, a slightly larger electrostatic capacitance than this embodiment. This embodiment is suitable for a case where a capacitance at the AC driving point is preferred to be as small as possible, that is, a case where the reactive power is small.

As shown in the table 1, the electrode thicknesses te according to the selection criterion of the first embodiment differ slightly from the electrode thicknesses te according to the selection criterion of this embodiment. Thus, in the case of determining the electrode thickness te by using the process shown in FIG. 8(b), when the electrode thickness is intended to be between the electrode thicknesses of these embodiments, the resonator having a large value in each of $\Delta C/\Delta x$ and $(\Delta C/\Delta x)^2/C$ can be provided.

Figure 16:
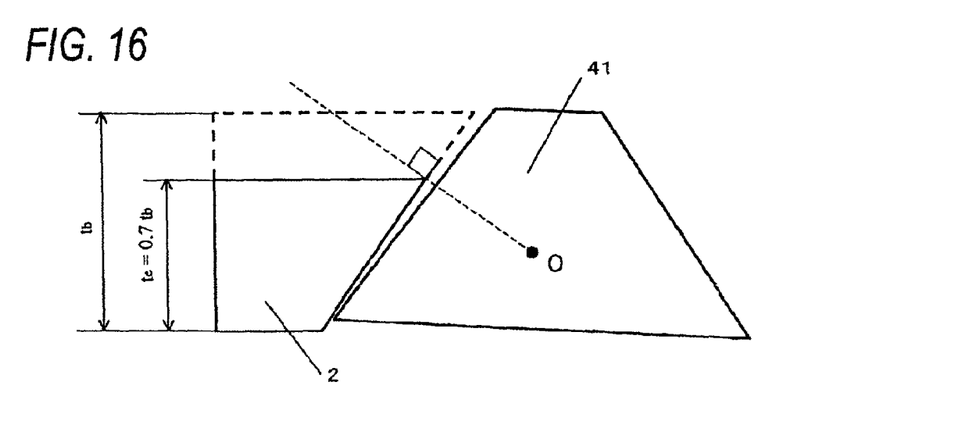
FIG. 16 is an explanatory diagram for easily determining an optimum electrode thickness in the fourth embodiment of the invention.

Incidentally, there is a method of determining the electrode thickness te easily without performing the calculation for the optimization of the electrode thickness te as shown in FIGS. 3, 9, 10 and 13. As an example of such a method, in the case of the trapezoidal section (a=100 nm) of FIG. 6(b), as shown in FIG. 16, when a cross point between the electrode and a perpendicular line which is dropped toward the electrode from the torsion center O of the section of the beam vibrator 41 is determined as the electrode thickness, the resonator having a large value in each of $\Delta C/\Delta x$ and $(\Delta C/\Delta x)^2/C$ shown in the table 1 can be provided. In FIG. 16, the electrode thickness te is 0.7 tb=0.14 μm.

Fifth Embodiment

Next, the fifth embodiment of the invention will be explained.

Although each of the first to fourth embodiments is explained as to a case where the sectional shape of the vibrator is a polygon, this embodiment is explained as to a case of a elliptical section.

Figure 17:
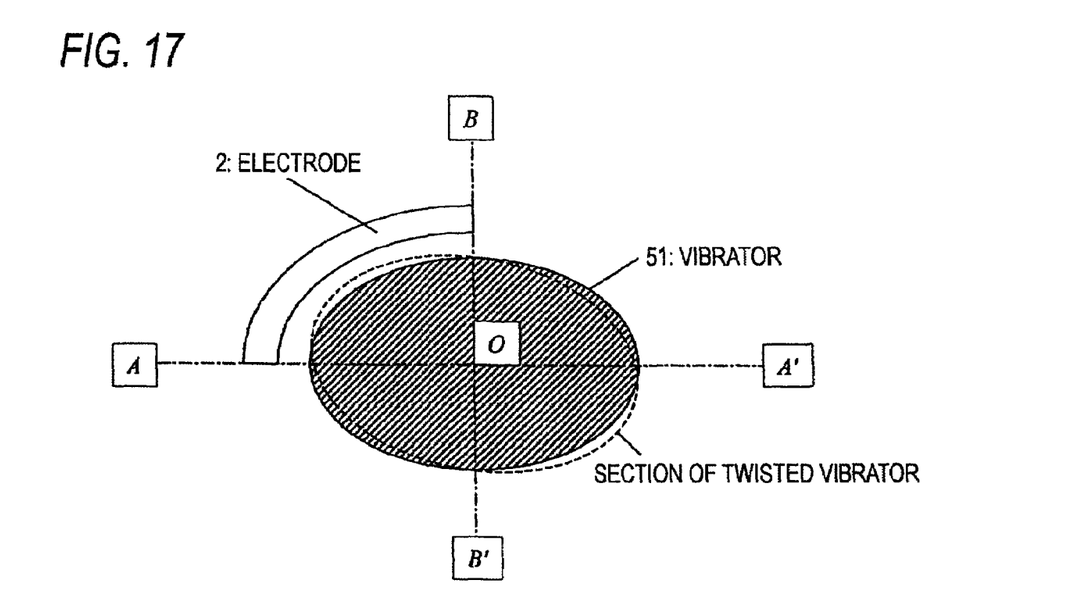
FIG. 17 is a diagram for explaining the relation between the sectional shape of a beam and an electrode in the fifth embodiment of the invention.

As shown in the schematic sectional explanatory diagram of the sections of the vibrator and the electrode in FIG. 17, the section of a vibrator 51 is elliptical and the gap between the electrode 2 and the vibrator 51 is formed to be uniform.

In this embodiment, the gap is formed to be almost uniform by using the sacrificial layer removing technique. The elevation angle of the electrode 2 seen from the origin O is desirably 90 degrees formed by the major axis A-A' and the minor axis B-B' or less.

According to this configuration, when the vibrator 51 is twisted by the electrostatic force, almost of the gap between the vibrator 51 and the electrode 2 is made narrow and so an area of the gap which is made large can be made small. As a result, $\Delta C/\Delta x$ can be made large.

INDUSTRIAL APPLICABILITY

The invention intends to realize a torsion resonator in which a quite fine construction capable of being manufactured by the semiconductor process is excited mainly by the electrostatic force, and the maximum exiting force or the maximum generating current or the maximum capacitance changing ratio per unit AC voltage can be obtained as to a beam-type vibrator which utilizes torsion resonation of a high Q value and can not be provided with any paddle. Thus, the torsion resonator according to the invention is useful as a high-frequency filter circuit etc. which is mounted on a portable-type radio terminal and integrated with a high density. Further, the torsion resonator according to the invention can be applied to the usage such as the spectrum analysis in an audio band or an ultrasonic band and a medical field and an environmental field of the mass analysis etc. using mechanical resonance.

The invention claimed is:

1. A torsion resonator serving as an electromechanical resonator including a vibrator for performing mechanical vibration and an electrode disposed near the vibrator, in which the vibrator is constituted so as to generate mechanical vibration in accordance with voltage change between the vibrator and the electrode, and electromechanical conversion is made possible between the voltage and the mechanical vibration, wherein
   the vibrator is configured by a beam structure and performs torsion vibration around a shaft along a longitudinal direction of the beam, and
   the electrode is disposed via a gap on a side surface of the vibrator of the beam structure to form an electrostatic capacitance between the vibrator and the electrode.

2. The torsion resonator according to claim 1, wherein a portion where a size of the gap becomes minimum along a width direction of the side surface of the vibrator is smaller than the width of the side surface of the vibrator.

3. The torsion resonator according to claim 1, wherein as to the capacitance C between the vibrator and the electrode and a displacement amount x due to torsion vibration of the vibrator, a shape and a position of the electrode are adjusted in accordance with a shape of the vibrator so that $\Delta C/\Delta x$ becomes maximum.

4. The torsion resonator according to claim 3, wherein the capacitance C between the vibrator and the electrode is adjusted in accordance with a ratio of a thickness of the electrode with respect to a thickness of the beam.

5. The torsion resonator according to claim 1, wherein as to the capacitance C between the vibrator and the electrode and a displacement amount x due to torsion vibration of the vibrator, a shape and a position of the electrode are adjusted in accordance with a shape of the vibrator so that $(\Delta C/\Delta x)^2/C$ becomes maximum.

6. The torsion resonator according to claim 1, wherein as to the capacitance C between the vibrator and the electrode and a displacement amount x due to torsion vibration of the vibrator, a value is between the electrode adjusted so that $(\Delta C/\Delta x)^{2/}C$ becomes maximum and the electrode adjusted so that $\Delta C/\Delta x$ becomes maximum.

7. The torsion resonator according to claim 1, wherein a sectional shape of the beam structure is polygon.

8. The torsion resonator according to claim 7, wherein the beam structure is formed by monocrystalline material and the side surface of the beam is a crystal orientation surface formed by anisotropic etching.

9. The torsion resonator according to claim 8, wherein the beam structure is formed by monocrystalline silicon and a section of the beam has a triangular or trapezoidal shape surrounded by $\{100\}$ and $\{111\}$ surfaces.

10. The torsion resonator according to claim 1, wherein a sectional shape of the beam structure is an ellipse.

11. The torsion resonator according to claim 1, wherein a plurality of the electrodes are provided in accordance with a torsion resonance mode number of the vibrator.

12. The torsion resonator according to claim 1, wherein a plurality of the torsion resonators electrically disposed in parallel are provided.

13. The torsion resonator according to claim 1, wherein an amplifier is constituted in a manner that the beam structure is formed by monocrystalline semiconductor material, a supporting portion formed by an impurity diffusion region of a conductive type in opposite to that of the vibrator is provided at each of both ends of the vibrator, the vibrator constituted by the beam structure is formed as a channel, and the supporting portions formed by the impurity diffusion regions is formed as a source region and a drain region, respectively.

14. The torsion resonator according to claim 1, wherein the torsion resonator is housed in a case within which the atmosphere is sealed in a vacuum state.

15. The filter characterized by using the torsion resonator according to claim 1.

* * * * *

UNITED STATES PATENT AND TRADEMARK OFFICE
CERTIFICATE OF CORRECTION

PATENT NO. : 7,358,648 B2
APPLICATION NO. : 10/592437
DATED : April 15, 2008
INVENTOR(S) : Kunihiko Nakamura and Hideki Kawakatsu It is certified that error appears in the above-identified patent and that said Letters Patent is hereby corrected as shown below:

In Column 12, line 53, please delete "$(\Delta C/\Delta x)/C = Q/k \cdot (\Delta C/\Delta x)^2/C \cdot V_p$" and insert therefor -- $(\Delta C/\Delta v)/C = Q/k \cdot (\Delta C/\Delta x)^2/C \cdot V_p$ --.

Signed and Sealed this

Twenty-third Day of June, 2009

JOHN DOLL
*Acting Director of the United States Patent and Trademark Office*